United States Patent
Tan

(10) Patent No.: US 6,272,369 B1
(45) Date of Patent: Aug. 7, 2001

(54) METHOD FOR OPTIMIZING FAT SUPPRESSION USING THE CHEMICAL SHIFT SELECTIVE MR IMAGING TECHNIQUE

(75) Inventor: Guosheng Tan, Waukesha, WI (US)

(73) Assignee: GE Medical Systems Global Technology Company LLC, Waukesha, WI (US)

(*) Notice: Subject to any disclaimer, the term of this patent is extended or adjusted under 35 U.S.C. 154(b) by 0 days.

(21) Appl. No.: 09/235,459

(22) Filed: Jan. 22, 1999

(51) Int. Cl.[7] .................................................. A61B 5/055
(52) U.S. Cl. .......................... 600/410; 324/307; 324/309
(58) Field of Search ........................... 600/410; 324/307, 324/309

(56) References Cited

U.S. PATENT DOCUMENTS

| 4,748,409 | 5/1988 | Frahm et al. ........................ 324/309 |
| 5,079,504 | * 1/1992 | Machida . |
| 5,079,505 | 1/1992 | Deimling et al. ..................... 324/311 |
| 5,329,231 | * 7/1994 | Hatta et al. . |

OTHER PUBLICATIONS

NMR Chemical Shift Selective (CHESS) Imaging, Phys. Med. Biol., 1985, vol. 30, No. 4, 341–344, Haase, et al.
Optimization of Chemical Shift Selective Suppression of Fat, p. 1981, Kuroda, et al.
Optimization of Chemical Shift Selective Suppression of Fat, MRM 40:506–510 (1998), Kuroda, et al.
Improved Water Suppression for Localized in Vivo [1]H Spectroscopy, JMR Series B, 106(1005) Feb., No. 2, Ernst, et al.
Improved Water and Lipid Suppression for 3D Press CSI Using RF Band Selective Inversion with Gradient Dephasing (Basic), MRM 38:311–321 (1997), Star–Lack, et al.

* cited by examiner

Primary Examiner—Marvin M. Lateef
Assistant Examiner—Runa Shah Qaderi
(74) Attorney, Agent, or Firm—Quarles & Brady, LLP; Christian G. Cabou

(57) ABSTRACT

The signal from fat is suppressed by a CHESS pulse sequence that precedes each imaging pulse sequence in an MRI scan. The effectiveness of the suppression is optimized by calculating a flip angle for the ChemSat RF saturation pulse in the CHESS pulse sequence based in part on prescribed scan parameters, such as the number of interleaved slices to be acquired.

10 Claims, 3 Drawing Sheets

METHOD FOR OPTIMIZING FAT SUPPRESSION USING THE CHEMICAL SHIFT SELECTIVE MR IMAGING TECHNIQUE

BACKGROUND OF THE INVENTION

The field of the invention is nuclear magnetic resonance imaging ("MRI") methods and systems. More particularly, the invention relates to the suppression of signal from fat by optimizing the chemical shift selective ("CHESS") MRI technique.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The majority of commercial MRI systems excite and image hydrogen nuclei. Hydrogen is present in the human body in many different molecules, and due to the different molecular level interactions, the Larmor frequency of the hydrogen is shifted in frequency. This "chemical shift" of the Larmor frequency results in a spectrum of frequencies in the acquired NMR signals. For example, in an MRI system with a polarizing field of 1.5 Tesla the major NMR signal component produced by hydrogen in fat molecules is shifted about 220 Hz from the signal produced by hydrogen in water molecules. This chemical shift is often expressed independently of field strength as 3.5 parts per million.

In some applications it is desirable to produce images only of the water molecules. In the article "H NMR Chemical Shift Selective (CHESS) Imaging", Haase, et al., *Phys. Med. Biol.*, 1985, vol. 30, No. 4, pp. 341–344, a technique is described in which the undesired signal component (e.g. fat) is first excited by a 90° RF excitation pulse which selectively saturates the spin magnetization prior to each imaging pulse sequence. The longitudinal magnetization of the undesired spins is thus maintained at a low level throughout the image acquisition and the NMR signals which they produce are suppressed. The CHESS sequence is comprised of an RF excitation pulse which is frequency selective to the undesired spin Larmor frequency, followed by a spoiler gradient pulse which dephases the resulting transverse magnetization prior to commencing the imaging pulse sequence.

In most applications of the CHESS method the fat signal to be suppressed is assumed to be a single signal component offset in frequency from the desired water signal. The frequency selective saturation pulse ("ChemSat pulse") produces a 90° flip angle for this signal component. In the publication "Optimization of Chemical Shift Selective Suppression of Fat", Proc., ISMRM, 6th Annual Meeting, pg. 1981 (1998) K. Kuroda, et al. describe a technique for calculating an optimal flip angle that takes into consideration the many different signal components in fat signals. While this work establishes that the flip angle can be optimized for the multiple fat signal components that are to be suppressed, it does not take into consideration the particular scan parameters used to acquire the image data.

SUMMARY OF THE INVENTION

The present invention is a method for practicing the CHESS technique in which the flip angle of the RF saturation pulse is optimized for the prescribed scan parameters prior to performing the scan. More particularly, the method includes: inputting the scan parameters, including parameters indicative of the TR period and the number (N) of frequency selective RF saturation pulses (ChemSat pulses) to be produced during each TR period; calculating an optimal flip angle for the ChemSat pulse based in part on the number (N) of ChemSat pulses during each TR; and acquiring MR image data with an imaging pulse sequence preceded by a CHESS pulse sequence that employs a ChemSat pulse having the optimal flip angle.

One of the many scan parameters input prior to acquiring image data is the number of slices to be acquired during each TR. Multi-slice acquisitions are common, and the number of slices varies from scan to scan. It is a discovery of the present invention that because ChemSat pulses are not spatially selective, the number of them applied during each TR has a substantial effect on the flip angle to be used for optimal suppression of selected frequency components. The optimal flip angle is thus calculated just prior to image acquisition after all the relevant scan parameters have been input.

GENERAL DESCRIPTION OF THE INVENTION

The major component of the signals produced by fat molecules has a chemical shift of about −220 Hz from the frequency of water at a polarizing field of 1.5 Tesla. While the other signal components are smaller, they do affect the quality of MRI images and should be considered in any fat suppression technique. Table 1 is a list of the fat signal components normalized to the largest component, $(CH_2)_n$.

TABLE 1

| No | Component | Amplitude A(n) | $T_1(n)$ (ms) | $T_2(n)$ (ms) | Chemical shift (ppm) | Freq shift from water signal (Hz) |
|---|---|---|---|---|---|---|
| 1 | $CH_2$ | 0.26 | 577 | 227 | 0.8 | −250 |
| 2 | $(CH_2)_n$ | 1.00 | 266 | 107 | 1.2 | −220 |
| 3 | $O=C-CH_2-CH$ | 0.10 | 185 | 43 | 1.5 | −200 |
| 4 | $C=C-CH_2$ | 0.21 | 209 | 67 | 1.9 | −180 |
| 5 | $O=C-CH_2$ | 0.11 | 210 | 71 | 2.15 | −160 |
| 6 | $C-CH_2-C=$ | 0.05 | 245 | 183 | 2.6 | −135 |
| 7 | $CH_2O$ (right) | 0.04 | 237 | 36 | 3.95 | −38 |
| 8 | $CH_2O$ (left) | 0.04 | 242 | 38 | 4.15 | −35 |
| 9 | $CH=CH$ and $CHO$ | 0.15 | 204 | 137 | 5.2 | 30 |

Figure 2:
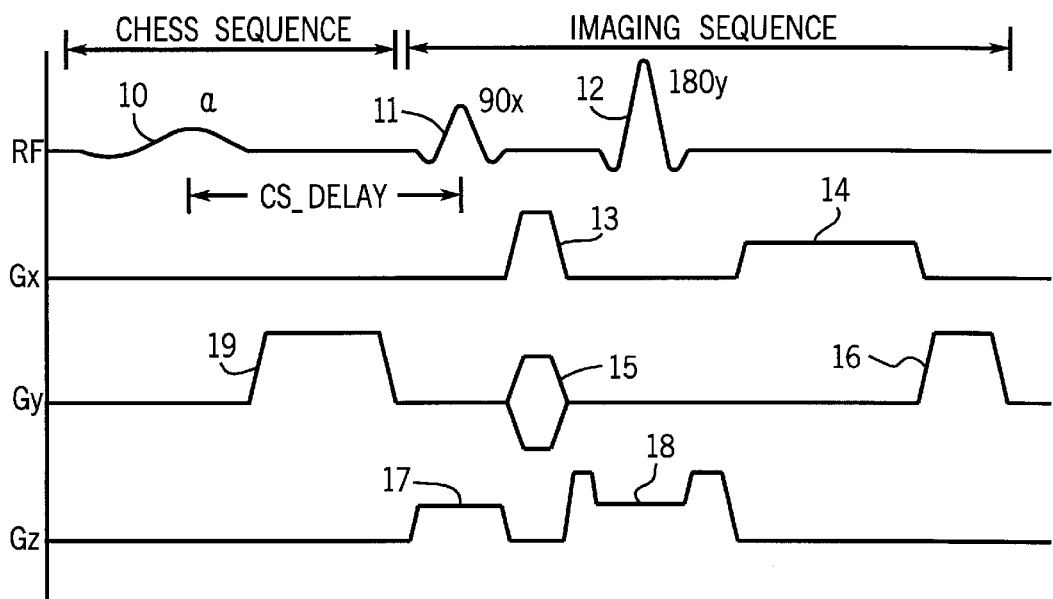
FIG. 2 is a graphic illustration of spin echo imaging pulse sequence proceeded by a CHESS pulse sequence.

Referring to FIG. 2, the CHESS pulse sequence includes an RF saturation pulse 10 having a flip angle α selected to saturate the selected fat spins such that their longitudinal magnetization $M_z$ is substantially zero at a time interval (CS-DELAY) thereafter when the RF excitation pulse 11 in the following imaging pulse sequence is produced. The imaging pulse sequence shown is a spin echo pulse sequence having a 180° RF refocusing pulse 12 and the well-known readout gradient pulses 13 and 14, phase encoding gradient pulses 15 and 16, and slice select gradient pulses 17 and 18. The CHESS sequence includes a spoiler gradient 19 applied along the phase encoding gradient axis to dephase the transverse magnetization produced by the RF saturation pulse 10.

The objective is to produce an RF saturation pulse 10 which is frequency selective to saturate the fat components listed in TABLE 1. The RF saturation pulse 10 will have a full excitation bandwidth (e.g. ±91.5 Hz at 90% amplitude) and transition bands (e.g. 50 Hz) in which the amplitude is less than 90%. If it is assumed that a desired flip angle of θ is produced then only certain ones of the signal components in TABLE 1 will be affected. For example, if only signal components 1–6 are subjected to the flip angle θ, this can be expressed for the signal components i as follows:

$$\alpha(i)=\theta \text{ for } 0<i\leq 6; \text{ and}$$
$$\alpha(i)=0 \text{ for } 7<i\leq 9. \qquad (1)$$

This assumes that one CHESS sequence followed by one imaging pulse sequence occurs and all spin magnetization fully recovers before the sequences are repeated. If only one slice or slab is acquired during each TR period, this assumption is correct. It is not correct, however, when a multi-slice acquisition is performed. This is because the ChemSat RF saturation pulse 10 is not spatially selective. That is, it excites spins throughout the bore of the MRI system with the result that spins in each acquired slice experience the ChemSat RF excitation N times per TR period, where N is the number of slices in the multi-slice acquisition.

Figure 3:
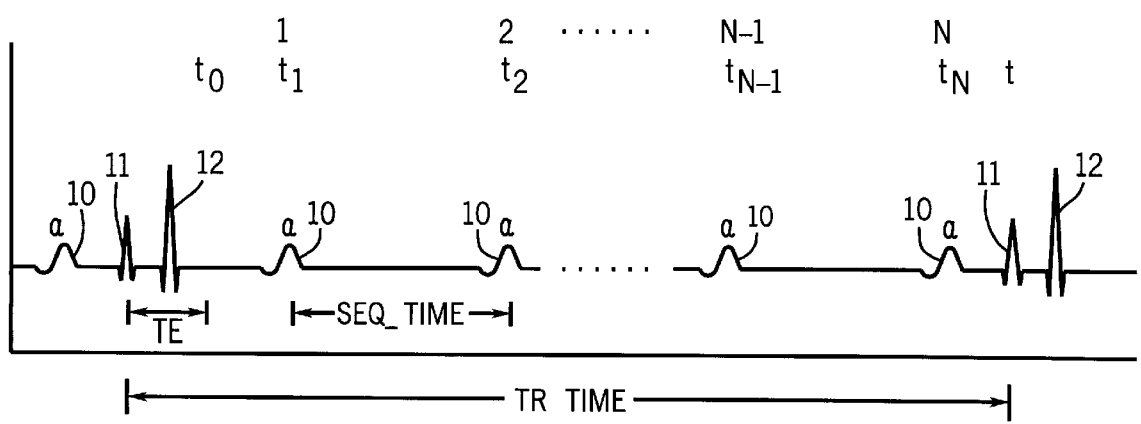
FIG. 3 is a graphic illustration of the RF pulses experienced by spins in one slice during a multi-slice scan using the pulse sequence of FIG. 2.

The net effect of employing the CHESS suppression technique for one slice in a multi-slice acquisition is illustrated in FIG. 3. It is apparent that the longitudinal magnetization $M_z$ of the spin components suppressed by the ChemSat RF pulse 10 do not relax, or recover for the entire TR period. The recovery time is determined by a number of factors, including the number of slices acquired.

According to the Bloch equation, longitudinal magnetization $M_z$ will relax to its equilibrium amplitude with a time constant of T1 when it is disturbed from its equilibrium state. Assuming the longitudinal magnetization is $M_z(t)$ at time t, after a time delay of Δt, the longitudinal magnetization at time (t+Δt) can be represented by equation (2):

$$M_z(t+\Delta t)=M_0+(M_z(t)-M_0)e^{-\Delta t/T1}. \qquad (2)$$

Using Eq. 2, the longitudinal magnetization at each time point, $t_0, t_1, \ldots t_N$, and $t_S$, when a ChemSat RF pulse 10 is produced can be calculated.

After the 90° excitation RF pulse 11 in each imaging pulse sequence, longitudinal magnetization $M_z$ is 0. After a time delay (relax_time) at time $t_0$, $M_z$ can be approximated to zero. This time delay (relax_time) equals the echo time (TE) in the spin echo sequence, but it equals etl*esp in a fast spin echo pulse sequence (where etl is the echo train length and esp is the echo spacing, and etl*esp is the echo time of the last echo in the echo train). According to Eq. 2, at the iso-center point of the first ChemSat RF pulse ($t_1$), $M_z$ for the ith fat component can be expressed by Eq. (3):

$$M_z(i,t_1)=M_0(i)-M_0(i)e^{-(seq\_time-relax\_time-cs\_delay)/T1(i)} \qquad (3)$$

Where i is the fat component in TABLE 1, and relax_time is equal to the TE time for the spin echo pulse sequence, or is equal to esp*etl for fast spin echo pulse sequence.

At time $t_n$ the magnetization has experienced n ChemSat RF pulses, and the longitudinal magnetization can be expressed by Eq. 4:

$$M_z(i,\theta,t_n)=M_0(i)+[M_z(i,t_n-1)\cos \alpha(i)-M_0(i)]e^{-seq\_time/T1(i)} \qquad (4)$$

Where n is from 1 to N.

At time $t_s$, $M_z$ can be expressed by Eq. 5:

$$M_z(i,\theta,t_s)=M_0(i)+[M_z(i,\theta,t_N)\cos \alpha(i)-M_0(i)]e^{-cs\_delay/T1(i)} \qquad (5)$$

And finally, the overall fat signal at the TE time can be approximated as:

$$M_{xy}(\theta, TE) = \sum_{i=1}^{9} M_z(i, \theta, t_s)e^{-TE/T2(i)} \qquad (6)$$

For a given scan protocol, the transverse magnetization $M_{xy}(\theta,TE)$ is a function of the ChemSat flip angle θ. The flip angle θ that corresponds to the minimum of the absolute value of $M_{xy}(\theta,TE)$ is optimal and will produce the best fat suppression. The optimal ChemSat flip angle is the same for all the slices in the protocol.

DESCRIPTION OF THE PREFERRED EMBODIMENT

Figure 1:
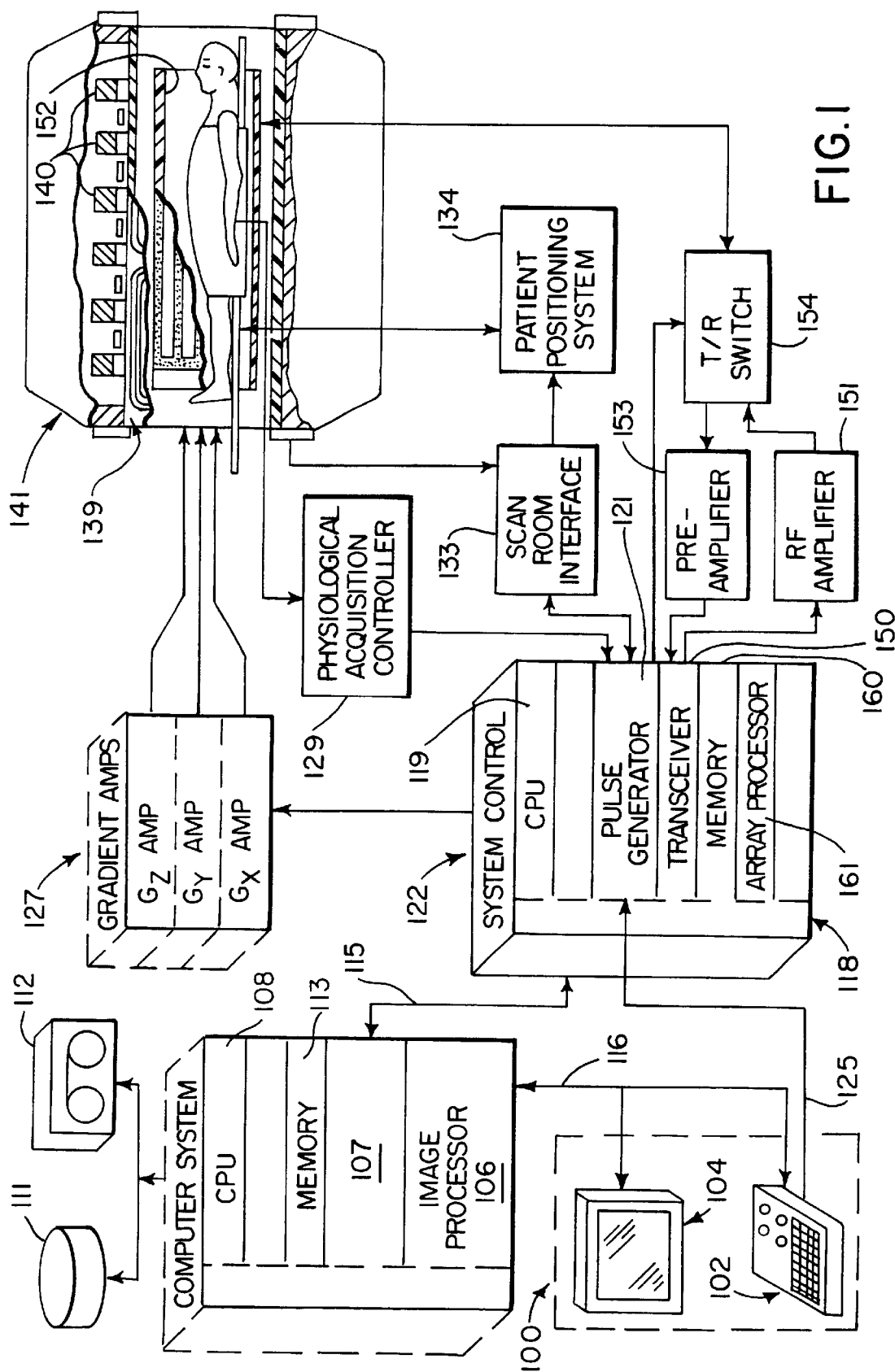
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

The present invention is employed when a scan is performed on the MRI system using a CHESS pulse sequence in combination with a selected imaging pulse sequence. As indicated above, the CHESS pulse sequence is appended before each imaging pulse sequence and the present invention optimizes the ChemSat RF saturation pulse to produce maximum suppression of fat signal.

Figure 4:
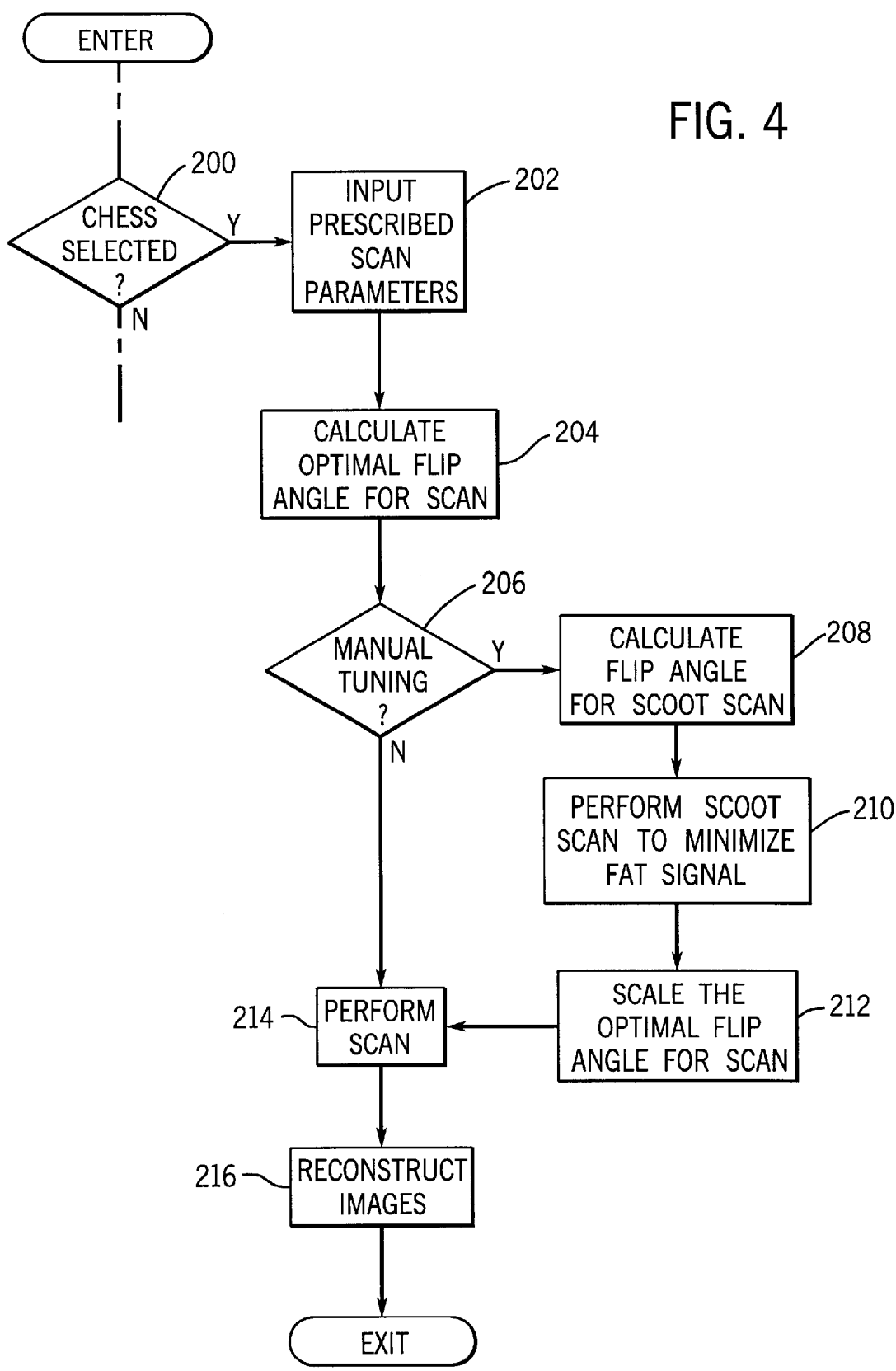
FIG. 4 is a flow chart of the steps performed in the preferred embodiment of the invention using the MRI system of FIG. 1.

Referring particularly to FIG. 4, when the operator elects to use the CHESS fat suppression method as indicated at decision block 200, the system branches to a program that directs the implementation of the method. As indicated at process block 202, the prescribed scan parameters for the CHESS sequence and the image sequence are then entered. These include the number of interleaved slices N per TR, relax_time, cs_delay, TE and TR as discussed above. The optimal ChemSat pulse flip angle θ is then calculated at process block 204 by minimizing $M_{xy}$ in the above equation (6). The optimal ChemSat pulse amplitude is determined from this optimal flip angle.

If manual tuning of fat suppression is elected, as determined at decision block 206, a scout scan will be employed in order to adjust the frequency offset and the amplitude of the manual tuning ChemSat RF pulse. The optimal flip angle of the ChemSat RF pulse for the scout scan is calculated at process block 208, and is normally different from the optimal flip angle of the imaging scan. The manual tuning involves minimizing the fat components (components 1–6 as described above) at about −220 Hz away from the water signal. The fine adjustments made to the ChemSat RF pulse during manual tuning in the scout scan is applied to the ChemSat pulse in the imaging scan. This is done by changing the scan ChemSat pulse amplitude by an amount proportional to the change made in the scout scan during manual tuning:

$$Amp_{scan} = Amp_{scan\_cal} * Amp_{scout}/Amp_{scout\_cal}$$

where:
- $Amp_{scan}$ is the ChemSat pulse amplitude that will be applied during the imaging scan;
- $Amp_{scan\_cal}$ is the ChemSat pulse amplitude from the optimization calculation for the imaging scan;
- $Amp_{scout}$ is the manual optimized ChemSat pulse amplitude during the scout scan;
- $Amp_{scout\_cal}$ is the ChemSat pulse amplitude calculated for the scout scan.

On the other hand, if the manual tuning option was not employed, the amplitude of the default ChemSat pulse is set to the calculated optimal amplitude as indicated at process block 210. In either case, the ChemSat RF saturation pulse for the CHESS sequence has been optimized for the particular scan that is to be performed.

As indicated at process block 214, the prescribed scan is then performed by downloading the scan parameters to the pulse generator module 121 and producing the pulse sequences necessary to acquire the NMR data. The acquired NMR data is used to reconstruct images as indicated at process block 216 and described above.

The optimal flip angle varies widely as a function of the imaging pulse sequence being used. For the spin echo pulse sequence the optimal flip angle has been found to be near or at 180° for most of the clinical protocols. This is in stark contrast to prior models which result in a flip angle of little over 90°. In addition to the improved fat suppression obtained with the optimal flip angle, it has been discovered that the fat suppression is far less sensitive to non-uniformity in the $B_1$ RF field than prior methods.

For the fast spin echo sequence in a 1.5 Tesla field, the optimal flip angle of the ChemSat RF pulse varies from about 100° to 180°, depending on the scan protocol. For example, a proton density protocol with 4 ETL and 15.63 kHz receiving bandwidth, the sequence time is 80 ms that results in to an optimal flip angle of 180°. For a T2 weighted imaging protocol of 8 ETL and 15.63 kHz receiving bandwidth, the sequence time is 150 ms which results in an optimal flip angle of 129°.

What is claimed is:

1. A method for acquiring an image with an MRI system, the steps comprising:
   a) entering scan parameters for an imaging pulse sequence, said scan parameters including the number of interleaved slices to be acquired;
   b) calculating an optimal flip angle for a ChemSat RF saturation pulse, said calculation being based in part on the number of interleaved slices to be acquired;
   c) acquiring image data with the MRI system using the imaging pulse sequence and preceding each imaging pulse sequence with the ChemSat saturation pulse; and
   d) reconstructing an image with the acquired image data.

2. The method as recited in claim 1 in which the ChemSat RF saturation pulse is part of a CHESS pulse sequence that precedes each imaging pulse sequence.

3. The method as recited in claim 2 in which the ChemSat RF saturation pulse suppresses signals produced by fat molecules.

4. The method as recited in claim 3 in which the CHESS pulse sequence includes a spoiler gradient that dephases transverse magnetization produced by the ChemSat RF saturation pulse.

5. The method as recited in claim 1 in which the imaging pulse sequence is a spin echo pulse sequence.

6. The method as recited in claim 1 in which the imaging pulse sequence is a fast spin echo pulse sequence.

7. The method as recited in claim 3 in which the ChemSat saturation pulse suppresses signals produced by fat molecules by tipping the longitudinal magnetization at the Larmor frequency of hydrogen nuclei in the fat molecules by the optimal flip angle.

8. The method as recited in claim 7 in which the optimal flip angle calculation is based in part on the time interval, cs_delay, between the ChemSat saturation pulse and a RF excitation pulse in the imaging pulse sequence that follows.

9. The method as recited in claim 1 in which the parameters of a manual ChemSat RF saturation pulse are calculated by performing a scout scan with the MRI system in which fat signal is suppressed in scout scan images, and the ChemSat RF saturation pulse employed in step c) is the optimal flip angle calculated in step b) adjusted by the calculated manual ChemSat RF saturation pulse.

10. The method as recited in claim 1 in which another scan parameter is echo time (TE) and the calculation of the optimal flip angle for the ChemSat RF saturation pulse is also based in part on the echo time (TE).

* * * * *